(12) United States Patent
Gong et al.

(10) Patent No.: US 10,658,612 B2
(45) Date of Patent: May 19, 2020

(54) DISPLAY PANEL HAVING PASSIVATION LAYER WITH PROTRUDING PORTIONS IN PERIPHERAL AREA FOR SEALANT

(71) Applicants: BOE TECHNOLOGY GROUP CO., LTD., Beijing (CN); HEFEI BOE OPTOELECTRONICS TECHNOLOGY CO., LTD., Hefei, Anhui (CN)

(72) Inventors: Kui Gong, Beijing (CN); Xianxue Duan, Beijing (CN); Hsiaowen Hung, Beijing (CN)

(73) Assignees: BOE TECHNOLOGY GROUP CO., LTD., Beijing (CN); HEFEI BOE OPTOELECTRONICS TECHNOLOGY CO., LTD., Hefei, Anhui (CN)

( * ) Notice: Subject to any disclaimer, the term of this patent is extended or adjusted under 35 U.S.C. 154(b) by 143 days.

(21) Appl. No.: 15/571,120

(22) PCT Filed: May 10, 2017

(86) PCT No.: PCT/CN2017/083790
§ 371 (c)(1),
(2) Date: Nov. 1, 2017

(87) PCT Pub. No.: WO2018/014632
PCT Pub. Date: Jan. 25, 2018

(65) Prior Publication Data
US 2018/0226604 A1 Aug. 9, 2018

(30) Foreign Application Priority Data
Jul. 19, 2016 (CN) .......................... 2016 1 0571225

(51) Int. Cl.
*H01L 51/52* (2006.01)
*H01L 27/32* (2006.01)
*H01L 51/56* (2006.01)

(52) U.S. Cl.
CPC .......... *H01L 51/5246* (2013.01); *H01L 27/32* (2013.01); *H01L 51/5203* (2013.01);
(Continued)

(58) Field of Classification Search
CPC .. H01L 51/5246; H01L 51/5203; H01L 27/32
See application file for complete search history.

(56) References Cited

U.S. PATENT DOCUMENTS

2008/0129946 A1* 6/2008 Chan ...................... G02F 1/1339
349/153
2011/0140599 A1* 6/2011 Lee ...................... H01L 51/5246
313/512
(Continued)

FOREIGN PATENT DOCUMENTS

CN 101867023 A 10/2010
CN 103325958 A 9/2013
(Continued)

OTHER PUBLICATIONS

First Office Action in the Korean Patent Application No. 20177032363, dated Jun. 7, 2018; English translation attached.
(Continued)

*Primary Examiner* — Matthew E. Gordon
(74) *Attorney, Agent, or Firm* — Intellectual Valley Law, P.C.

(57) ABSTRACT

The present application discloses a display panel. The display panel includes a first substrate; and a second substrate facing the first substrate. The first substrate includes a base substrate and a passivation layer on the base substrate. The passivation layer includes a base portion and a protruding
(Continued)

portion on a side of the base portion distal to the base substrate. The protruding portion is in a peripheral area of the display panel and encloses a display area of the display panel.

18 Claims, 9 Drawing Sheets

(52) U.S. Cl.
CPC .......... *H01L 51/5259* (2013.01); *H01L 51/56* (2013.01); *H01L 51/524* (2013.01); *H01L 51/5253* (2013.01); *H01L 2251/5369* (2013.01)

(56) References Cited

U.S. PATENT DOCUMENTS

| | | | |
|---|---|---|---|
| 2014/0118640 | A1 | 5/2014 | Chen |
| 2014/0353599 | A1 | 12/2014 | Kang |
| 2015/0280167 | A1 | 10/2015 | Zhang |
| 2015/0349288 | A1 | 12/2015 | Luo et al. |
| 2016/0343979 | A1* | 11/2016 | Liu .................... H01L 51/56 |
| 2017/0194597 | A1 | 7/2017 | Pang |

FOREIGN PATENT DOCUMENTS

| | | |
|---|---|---|
| CN | 104037196 A | 9/2014 |
| CN | 104538555 A | 4/2015 |
| CN | 104538566 A | 4/2015 |
| CN | 104979373 A | 10/2015 |
| JP | 11329717 A | 11/1999 |
| JP | 2006332019 A | 12/2006 |
| KR | 20140140983 A | 12/2014 |
| WO | 2013011741 A1 | 1/2013 |

OTHER PUBLICATIONS

First Office Action in the Chinese Patent Application No. 201610571225.1, dated May 31, 2017; English translation attached.
Second Office Action in the Chinese Patent Application No. 201610571225.1, dated Nov. 10, 2017; English translation attached.
Second Office Action in the Korean Patent Application No. 20177032363, dated Dec. 27, 2018; English translation attached.
International Search Report & Written Opinion dated Aug. 16, 2017, regarding PCT/CN2017/083790.

\* cited by examiner

DISPLAY PANEL HAVING PASSIVATION LAYER WITH PROTRUDING PORTIONS IN PERIPHERAL AREA FOR SEALANT

CROSS-REFERENCE TO RELATED APPLICATION

This application is a national stage application under 35 U.S.C. § 371 of International Application No. PCT/CN2017/083790, filed May 10, 2017, which claims priority to Chinese Patent Application No. 201610571225.1, filed Jul. 19, 2016, the contents of which are incorporated by reference in the entirety.

TECHNICAL FIELD

The present invention relates to display technology, more particularly, to a display substrate, a display panel, a display apparatus, and a method of fabricating a display substrate and a display panel.

BACKGROUND

Display apparatuses such as liquid crystal display (LCD) apparatuses and organic light-emitting diode (OLED) display apparatuses have been widely used. Typically, a liquid crystal display apparatus includes a counter substrate and an array substrate facing each other. Thin film transistors, gate lines, data lines, pixel electrodes, common electrodes, and common electrode lines are disposed on the array substrate and the counter substrate. Between the two substrates, a liquid crystal material is injected to form a liquid crystal layer. Typically, an organic light-emitting diode display apparatus includes a counter substrate and an array substrate facing each other. The array substrate in the organic light-emitting diode display apparatus includes an anode, a light emitting layer and a cathode. In the liquid crystal display apparatuses and the organic light-emitting diode display apparatuses, the array substrate and the counter substrate are typically sealed together using a frame sealant such as an optical clear resin.

SUMMARY

In one aspect, the present invention provides a display panel, comprising a first substrate; and a second substrate facing the first substrate; wherein the first substrate comprises a base substrate; and a passivation layer on the base substrate, the passivation layer comprising a base portion and a protruding portion on a side of the base portion distal to the base substrate; wherein the protruding portion is in a peripheral area of the display panel and encloses a display area of the display panel.

Optionally, the display panel further comprises a sealant layer on a side of the protruding portion distal to the base portion; wherein the sealant layer is in a peripheral area of the display panel, and configured to seal the first substrate and the second substrate together to form a cell.

Optionally, the protruding portion and the base portion are integral parts of the passivation layer, and comprise a same material.

Optionally, the protruding portion and the base portion comprises silicon nitride.

Optionally, the passivation layer has a total thickness in a range of approximately 5 µm to approximately 20 µm; and the protruding portion has a thickness in a range of approximately 2 µm to approximately 19 µm.

Optionally, the sealant layer has a thickness less than 50% of that of the protruding portion.

Optionally, the display panel is an organic light emitting diode display panel, further comprising an organic light emitting layer on the base substrate; and an encapsulating film on a side of the organic light emitting layer distal to the base substrate for encapsulating the organic light emitting layer.

Optionally, the display panel further comprises a thin film transistor on a side of the passivation layer proximal to the base substrate; and a pixel electrode on a side of the passivation layer distal to the base substrate; wherein the pixel electrode is connected to a source electrode of the thin film transistor through a via extending through the passivation layer.

Optionally, the protruding portion has a corrugated surface on a side distal to the base portion.

In another aspect, the present invention provides a display apparatus comprising the display panel described herein.

In another aspect, the present invention provides a display substrate, comprising a base substrate; and a passivation layer on the base substrate, the passivation layer comprising a base portion and a protruding portion on a side of the base portion distal to the base substrate; wherein the protruding portion is in a peripheral area of the display substrate and encloses a display area of the display substrate.

Optionally, the protruding portion and the base portion are integral parts of the passivation layer, and comprise a same material.

Optionally, the protruding portion and the base portion comprises silicon nitride.

Optionally, the passivation layer has a total thickness in a range of approximately 5 µm to approximately 20 µm; and the protruding portion has a thickness in a range of approximately 2 µm to approximately 19 µm.

In another aspect, the present invention provides a method of fabricating a display substrate, comprising forming a passivation layer on a base substrate, the passivation layer is formed to comprise a base portion and a protruding portion on a side of the base portion distal to the base substrate; wherein the protruding portion is formed in a peripheral area of the display substrate and encloses a display area of the display substrate.

Optionally, forming the passivation layer comprises forming a passivation material layer on the base substrate; forming a first photoresist layer on a side of the passivation material layer distal to the base substrate, the first photoresist layer being in a first region corresponding to the protruding portion; reducing a thickness of the passivation material layer outside the first region, thereby forming the base portion; and removing the first photoresist layer subsequent to reducing the thickness of the passivation material layer outside the first region, thereby forming the protruding portion.

Optionally, prior to forming the first photoresist layer, the method further comprising forming a second photoresist layer on a side of the passivation material layer distal to the base substrate, the second photoresist layer being in a region outside a second region corresponding to a first via in the passivation layer; partially removing the passivation material layer in the second region thereby forming a second via; and removing the second photoresist layer outside the first region, thereby forming the first photoresist layer; wherein during reducing the thickness of the passivation material layer outside the first region, the passivation material layer in the second region is completely removed, thereby forming the first via, the first via extending through the passivation layer.

Optionally, prior to forming the forming the passivation material layer, the method further comprising forming a thin film transistor on the base substrate, the thin film transistor comprising a source electrode; and subsequent to forming the first via, the base portion and the protruding portion, the method further comprising forming a pixel electrode on a side of the passivation layer distal to the base substrate, the pixel electrode connected to the source electrode through the first via.

Optionally, the base portion, the protruding portion, and the first via are formed in a single process using a single mask plate.

In another aspect, the present invention provides a method of fabricating a display panel, comprising forming a first substrate according to the method described herein; forming a second substrate; and assembling the first substrate and the second substrate in a cell; wherein forming the second substrate comprises forming a sealant material layer on a second base substrate, the sealant material layer is formed in a peripheral area of the second substrate and enclosing a display area of the second substrate; and assembling the first substrate and the second substrate in the cell comprises adhering the sealant material layer onto the protruding portion, thereby forming a sealant layer sealing a display area of the display panel.

Optionally, forming the second substrate further comprises forming an encapsulating film on the second base substrate in a display area of the second substrate; and subsequent to assembling the first substrate and the second substrate, the encapsulating film encapsulates display units in the display area of the display panel.

BRIEF DESCRIPTION OF THE FIGURES

The following drawings are merely examples for illustrative purposes according to various disclosed embodiments and are not intended to limit the scope of the present invention.

DETAILED DESCRIPTION

The disclosure will now be described more specifically with reference to the following embodiments. It is to be noted that the following descriptions of some embodiments are presented herein for purpose of illustration and description only. It is not intended to be exhaustive or to be limited to the precise form disclosed.

Figure 1:
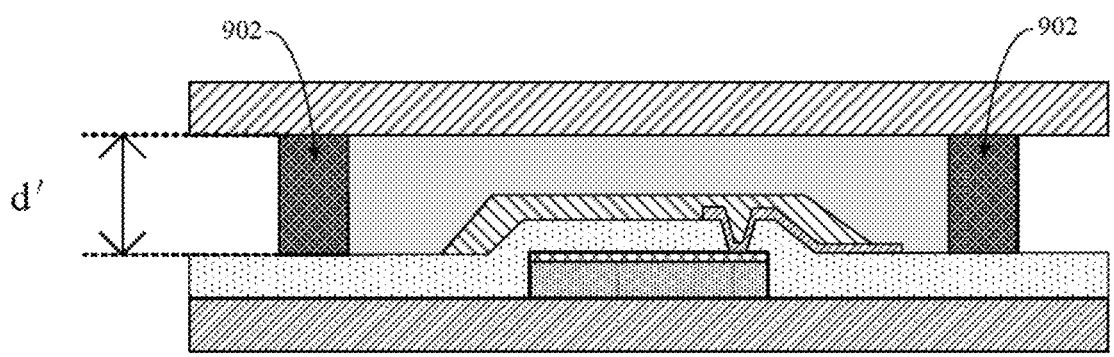
FIG. 1 is a schematic diagram illustrating the structure of a conventional display panel.

The array substrate and counter substrate in a conventional display panel are typically sealed together using a sealant layer. FIG. 1 is a schematic diagram illustrating the structure of a conventional display panel. Referring to FIG. 1, the sealant layer 902 in the conventional display panel extends substantially throughout the space between the array substrate and the counter substrate. The sealant layer 902 has a thickness d' which is substantially the same as the distance between the array substrate and the counter substrate. Thus, the sealant layer 902 in the conventional display panel has a large area exposed to the external environment. Typically, the sealant layer 902 is made of a curable organic sealant material. The cured sealant material is porous and prone to defects caused by the curing process. Oxygen and moist can permeate through the pores and defects in sealant layer 902, deteriorating the electronic properties of the display components in the display area and reducing the life time of the display panel.

Accordingly, the present disclosure provides, inter alia, a display substrate, a display panel, a display apparatus, and a method of fabricating a display substrate and a display panel that substantially obviate one or more of the problems due to limitations and disadvantages of the related art. In one aspect, the present disclosure provides a display panel. In some embodiments, the display panel includes a first substrate and a second substrate facing the first substrate. The first substrate in the display panel in some embodiments includes a base substrate; and a passivation layer on the base substrate, the passivation layer including a base portion and a protruding portion on a side of the base portion distal to the base substrate. Optionally, the protruding portion is in a peripheral area of the display panel and encloses a display area of the display panel.

As used herein the term "peripheral area" refers to an area of a display panel or a display substrate (e.g., an array substrate or a counter substrate) in the display panel where various circuits and wires are provided to transmit signals to the display panel or display substrate. To increase the transparency of the display apparatus, non-transparent or opaque components of the display apparatus (e.g., battery, printed circuit board, metal frame), can be disposed in the peripheral area rather than in the display areas. As used herein, the term "display area" refers to an area of a display panel or a display substrate (e.g., an array substrate or a counter substrate) in a display panel where image is actually displayed.

Figure 2:
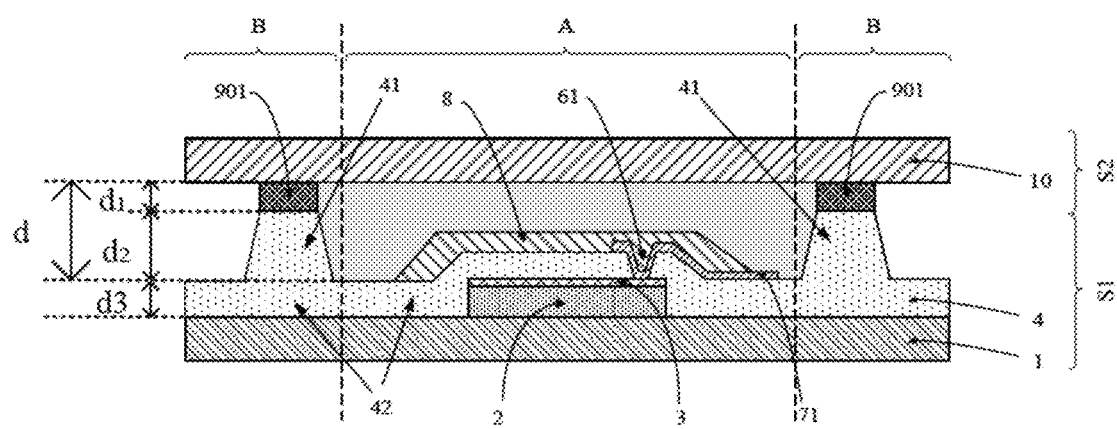
FIG. 2 is a schematic diagram illustrating the structure of a display panel in some embodiments according to the present disclosure.

FIG. 2 is a schematic diagram illustrating the structure of a display panel in some embodiments according to the present disclosure. Referring to FIG. 2, the display panel in some embodiments includes a display area A and a peripheral area B. The display area A includes a plurality of subpixels for image display. As shown in FIG. 2, the display panel includes a first substrate S1 and a second substrate S2 facing the first substrate S1. The first substrate S1 includes a first base substrate 1 and a passivation layer 4 on the base substrate 1. The passivation layer 4 includes a base portion 42 and a protruding portion 41 on a side of the base portion 42 distal to the base substrate 1. The protruding portion 41 is in the peripheral area B of the display panel, and encloses a display area A of the display panel. The base portion 42 extends throughout the display area A and the peripheral area B.

The second substrate S2 in some embodiments includes a second base substrate 10 and a sealant layer 901 on the second base substrate 10. The sealant layer 901 corresponds to the protruding portion 41. The sealant layer 901 is on a side of the protruding portion 41 distal to the base portion 42, and is in a peripheral area B of the display panel. The sealant layer 901 is configured to seal the first substrate S1

(specifically the protruding portion 41) and the second substrate S2 together to form a cell.

A distance between the second substrate S2 and the first substrate S1 is defined as the distance d between a surface of a second base substrate 10 of the second substrate S2 and a surface of the base portion 42 of the passivation layer 4. The distance d is a sum of a distance d1 which is equal to a height of the sealant layer 901 and a distance d2 which is equal to a height of the protruding portion 41. The sealant layer 901 includes a sealant material (e.g., a UV curable resin) that adheres to the protruding portion 41 to seal the first substrate S1 and the second substrate S2 together. By having the protruding portion 41, an amount of sealant material required to seal the present display panel is much reduced. For example, in the conventional display panel of FIG. 1, a sealant layer 902 having a thickness d is required to seal the display panel, whereas the thickness of the sealant layer 901 is significantly reduced to d1 in the present display panel. The issue of oxygen and moist permeation through the pores and defects of sealant layer 901 can be obviated as the total area of the sealant layer 901 exposing to the external environment is much smaller than that in the conventional display panel. The protruding portion 41 makes up a majority of the barrier isolating the inside of the display panel from the external environment. Because the protruding portion 41 is made of a passivation material having a high hermeticity, the present display panel is highly oxygen resistant and moist resistant.

In some embodiments, the sealant layer 901 has a thickness d1 less than 50% of a thickness d2 of the protruding portion 41. Optionally, the thickness d1 is less than 25% of the thickness d2 of the protruding portion 41. Optionally, the thickness d1 is less than 10% of the thickness d2 of the protruding portion 41. Optionally, the thickness d1 is less than 5% of the thickness d2 of the protruding portion 41.

In some embodiments, the thickness d1 is less than 35% of the thickness d between the second substrate S2 and the first substrate S1. Optionally, the thickness d1 is less than 25% of the thickness d. Optionally, the thickness d1 is less than 10% of the thickness d. Optionally, the thickness d1 is less than 5% of the thickness d. Optionally, the thickness d1 is less than 2.5% of the thickness d.

Optionally, the protruding portion 41 has a thickness d2 in a range of approximately 2 μm to approximately 19 μm, e.g., approximately 2 μm to approximately 5 μm, approximately 5 μm to approximately 10 μm, and approximately 10 μm to approximately 19 μm. Optionally, the passivation layer has a total thickness (e.g., the sum of d2 and d3) in a range of approximately 5 μm to approximately 20 μm.

In some embodiments, the protruding portion 41 and the base portion 42 are integral parts of the passivation layer 4. For example, the protruding portion 41 and the base portion 42 are made of a same material and formed in a single patterning process. As used herein, the term "single patterning process" refers to a patterning process using a single mask plate for fabricating one or more layers or portions. Optionally, a single patterning process involves exposing a substrate with a single mask only once, and subsequently forming one or more layers or portions by one or more developing steps, one or more etching steps, and one or more plasma treatment steps, one or more doping steps, one or more ion implantation steps, etc.

Various appropriate insulating materials and various appropriate fabricating methods may be used to make the passivation layer 4. For example, the passivation layer 4 may be fabricated by a lithography method. Optionally, the passivation layer 4 is made of an inorganic insulating material. Examples of appropriate materials for making the passivation layer 4 include, but are not limited to, inorganic insulating materials and organic insulating materials. Examples of appropriate inorganic insulating materials include, but are not limited to, silicon oxide, silicon nitride (e.g., $Si_3N_4$), and silicon oxynitride ($SiO_xN_y$). Examples of appropriate organic insulating materials include, but are not limited to, resins, polyimide, etc. Optionally, the passivation layer 4 is made of an inorganic material. Optionally, both the protruding portion 41 and the base portion 42 are made of silicon nitride due to its high hermeticity.

Referring to FIG. 2, the first substrate S1 in some embodiments further includes a plurality of thin film transistors 2 respectively in a plurality of subpixels. Each of the plurality of thin film transistors 2 is on a side of the passivation layer 4 proximal to the base substrate 1. Each of the plurality of thin film transistors 2 includes a source electrode 3. The first substrate S1 further includes a pixel electrode 71 on a side of the passivation layer 4 distal to the base substrate 1. The source electrode 3 and the pixel electrode 71 are electrically connected through a first via 61 extending through the passivation layer 4.

In some embodiments, the display panel is an organic light emitting diode display panel, and the display panel further includes an organic light emitting layer 8 on a side of the passivation layer 4 distal to the base substrate 1, and an encapsulating film 11 on a side of the organic light emitting layer 8 distal to the base substrate 1 for encapsulating display units (e.g., the organic light emitting layer 8) of the display panel.

In some embodiments, the display panel is a liquid crystal display panel.

Optionally, the first substrate S1 is an array substrate and the second substrate S2 is a counter substrate (e.g., an encapsulating substrate in an organic light emitting diode display apparatus). Optionally, the first substrate S1 is a counter substrate and the second substrate S2 is an array substrate.

In some embodiments, the protruding portion 41 has a corrugated surface on a side distal to the base portion 42. By having a corrugated surface on the protruding portion 41, the sealant layer 901 and the protruding portion 41 cooperatively seal the first substrate S1 and the second substrate S2 together. For example, at the interface between the sealant layer 901 and the protruding portion 41, a sealant material of the sealant layer 901 is in contact with (e.g., bonded with) the protruding portion 41. The interface is substantially impermeable to external oxygen or moist. As compared to the conventional display panels in which the interface between the sealant layer and the substrate is a substantially flat interface, the interface in the present display panel has a corrugated interface, which makes it significantly more difficult for external oxygen and moist to permeate through into the inside of the display panel. As a result, the present display panel is highly oxygen-resistant and moist-resistant.

As used herein, the term "corrugated surface" refers to a non-level surface having a plurality of protrusions and a plurality of concaved portions relative to the plurality of protrusions. A corrugated surface may include a wide variety of periodic or non-periodic structuration, deformation, induced roughness, undulation, texturing or the combination thereof. Optionally, the plurality of corrugated protrusions are spaced apart by the plurality of concaved portions. Optionally, the corrugated surface in the context of the present disclosure has a typical distance between two adjacent apexes of the corrugated protrusions in the range of approximately 0.1 mm to approximately 1 mm. Optionally, the corrugated surface in the context of the present disclosure has a typical distance between two adjacent nadirs of the corrugated concaved portions in the range of approximately 0.1 mm to approximately 1 mm. Optionally, the corrugated surface in the context of the present disclosure has a typical height difference between an apex of a corrugated protrusion and a nadir of an adjacent corrugated concaved portion in the range of approximately 0.1 mm to approximately 1 mm.

In another aspect, the present disclosure provides a display substrate. In some embodiments, the display substrate includes a base substrate and a passivation layer on the base substrate, the passivation layer including a base portion and a protruding portion on a side of the base portion distal to the base substrate. The protruding portion is in a peripheral area of the display substrate and encloses a display area of the display substrate. Optionally, the base portion extends throughout the display area and the peripheral area.

In some embodiments, the protruding portion and the base portion are integral parts of the passivation layer. For example, the protruding portion and the base portion are made of a same material and formed in a single patterning process. Optionally, the protruding portion and the base portion are made of a same inorganic insulating material. e.g., silicon nitride.

Optionally, the protruding portion 41 has a thickness d2 in a range of approximately 2 μm to approximately 19 μm, e.g., approximately 2 μm to approximately 5 μm, approximately 5 μm to approximately 10 μm, and approximately 10 μm to approximately 19 μm. Optionally, the passivation layer has a total thickness (e.g., the sum of d2 and d3) in a range of approximately 5 μm to approximately 20 μm.

In some embodiments, the display substrate further includes a plurality of thin film transistors respectively in a plurality of subpixel areas of the display substrate. Each of the plurality of thin film transistors is on a side of the passivation layer proximal to the base substrate. Each of the plurality of thin film transistors includes a source electrode. The display substrate in some embodiments further includes a pixel electrode on a side of the passivation layer distal to the base substrate. The source electrode and the pixel electrode are electrically connected through a first via extending through the passivation layer.

In some embodiments, the display substrate is an organic light emitting diode display substrate, and the display substrate further includes an organic light emitting layer on a side of the passivation layer distal to the base substrate, and an encapsulating film on a side of the organic light emitting layer distal to the base substrate for encapsulating display units (e.g., the organic light emitting layer) of the display substrate.

Optionally, the display substrate is an array substrate. Optionally, the display substrate is a counter substrate, e.g., an encapsulating substrate in an organic light emitting diode display apparatus.

In another aspect, the present disclosure provides a method of fabricating a display substrate. In some embodiments, the method includes forming a passivation layer on a base substrate. Optionally, the step of forming the passivation layer includes forming a base portion of the passivation layer and forming a protruding portion of the passivation layer. Optionally, the passivation layer is formed to have a base portion and a protruding portion on a side of the base portion distal to the base substrate. The protruding portion is formed in a peripheral area of the display substrate and encloses a display area of the display substrate. The base portion is formed to extend throughout the display area and the peripheral area. Optionally, the base portion and the protruding portion are formed separately. Optionally, the base portion and the protruding portion are formed in a single patterning process.

In some embodiments, the step of forming the passivation layer includes forming a passivation material layer on the base substrate; and patterning the passivation material layer in a single patterning process to form the base portion and the protruding portion. Optionally, the method further includes forming a first via extending through the passivation layer. Optionally, the first via, the base portion, and the protruding portion are formed in a single patterning process, e.g., using a single mask plate. Optionally, the passivation material layer is patterned using a half-tone mask plate or a gray-tone mask plate.

In some embodiments, the step of forming the passivation layer includes forming a passivation material layer on the base substrate; forming a first photoresist layer on a side of the passivation material layer distal to the base substrate, the first photoresist layer being in a first region corresponding to the protruding portion; reducing a thickness of the passivation material layer outside the first region, thereby forming the base portion; and removing the first photoresist layer subsequent to reducing the thickness of the passivation material layer outside the first region, thereby forming the protruding portion.

In some embodiments, prior to forming the first photoresist layer, the method further includes forming a second photoresist layer on a side of the passivation material layer distal to the base substrate, the second photoresist layer being in a region outside a second region corresponding to a first via in the passivation layer; partially removing the passivation material layer in the second region thereby forming a second via; and removing the second photoresist layer outside the first region, thereby forming the first photoresist layer. Optionally, during the step of reducing the thickness of the passivation material layer outside the first region, the passivation material layer in the second region is completely removed, thereby forming the first via, the first via extending through the passivation layer.

In some embodiments, prior to forming the passivation material layer, the method further includes forming a thin film transistor on the base substrate, the thin film transistor including a source electrode. Optionally, subsequent to forming the first via, the base portion and the protruding portion, the method further includes forming a pixel electrode on a side of the passivation layer distal to the base substrate, the pixel electrode connected to the source electrode through the first via.

Figure 3:
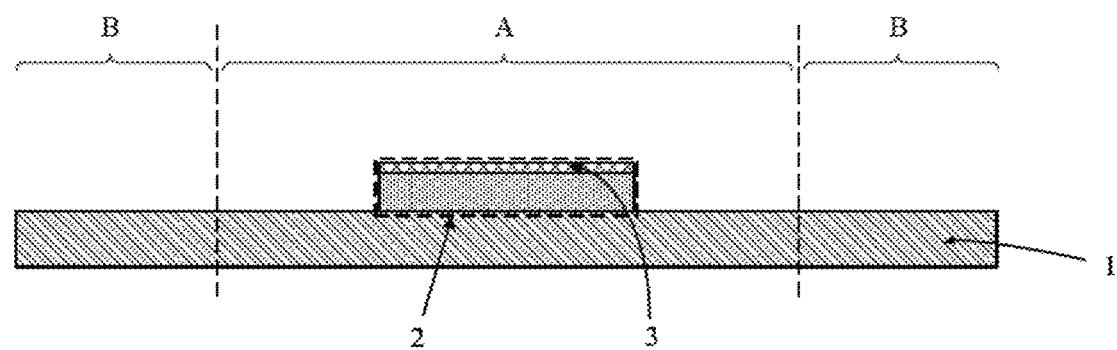
FIGS. 3 to 12 illustrate a process of forming an array substrate of the display panel in some embodiments according to the present disclosure.
Figure 4:
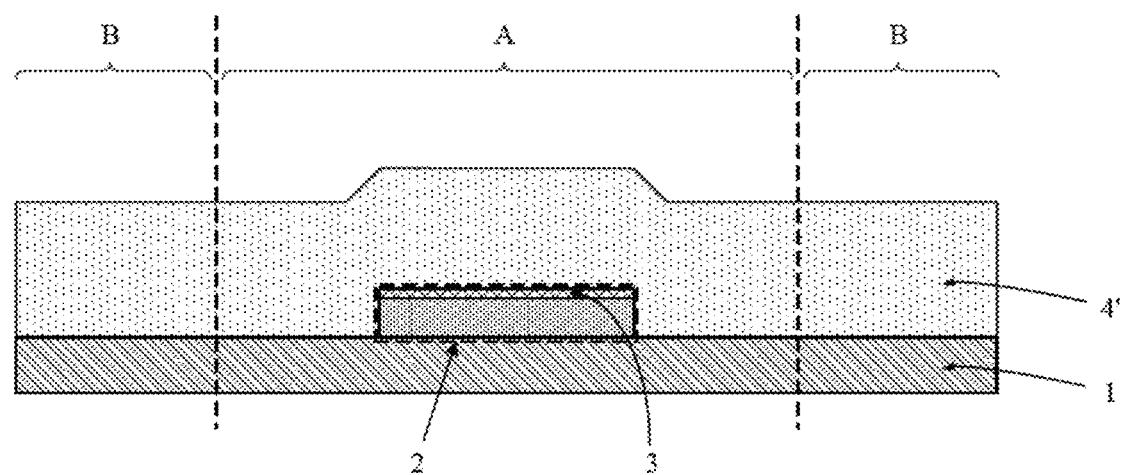
Figure 5:
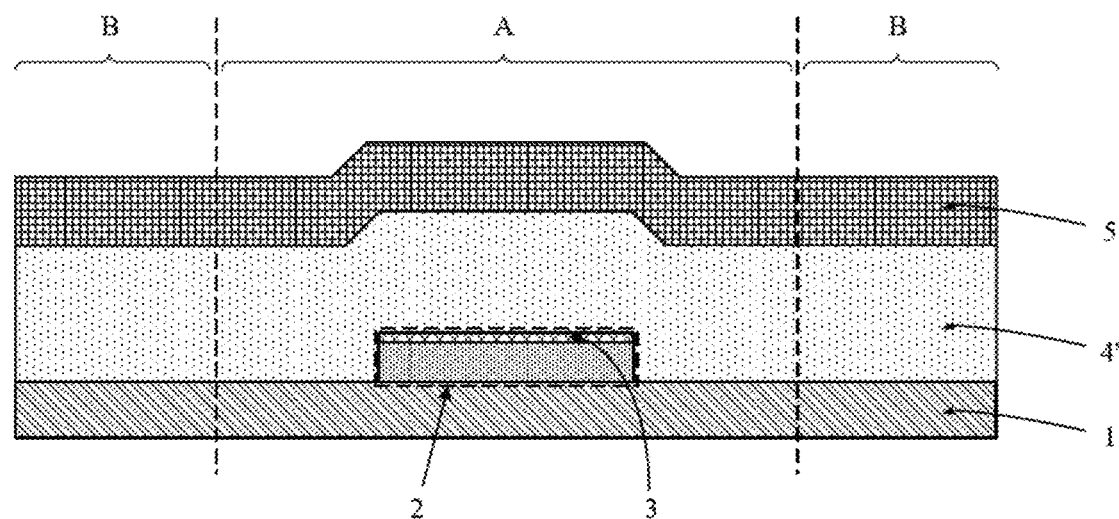
Figure 6:
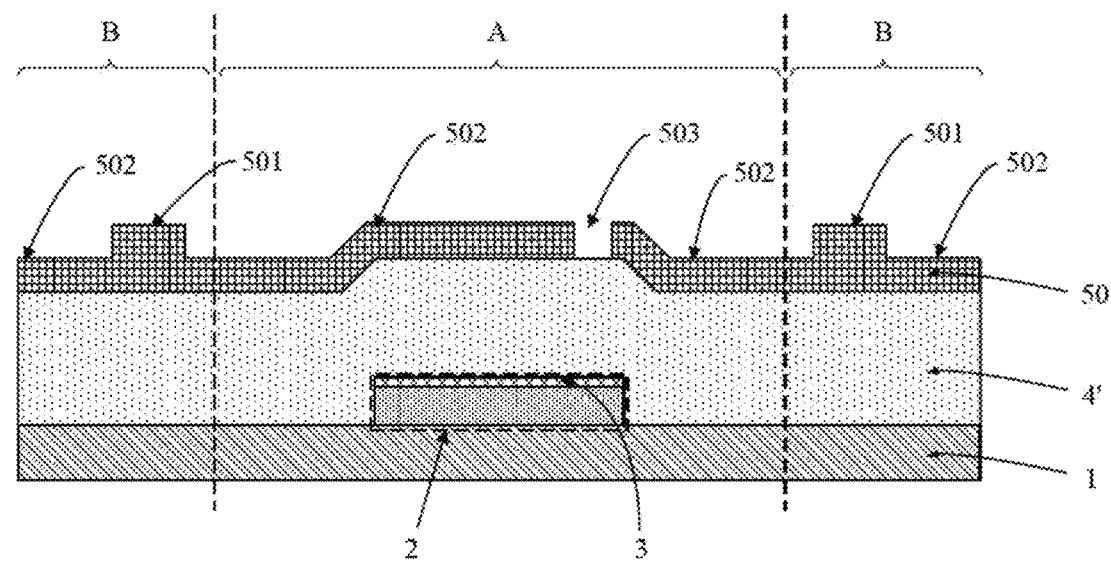

FIGS. 3 to 12 illustrate a process of forming an array substrate of the display panel in some embodiments according to the present disclosure. Referring to FIG. 3, the method in some embodiments includes forming a thin film transistor 2 on a base substrate 1 in a display area A of the array substrate. The step of forming the thin film transistor includes forming a source electrode 3. Referring to FIG. 4, the method further includes forming a passivation material layer 4' on a side of the thin film transistor 2 distal to the base substrate 1. The passivation material layer 4' is formed in both the display area A and a peripheral area B of the array substrate. Referring to FIG. 5, the method further includes forming a photoresist material layer 5 on a side of the passivation material layer 4' distal to the base substrate 1. Referring to FIG. 6, the method in some embodiments further includes forming a second photoresist layer 50 on a side of the passivation material layer 4' distal to the base substrate 1, the second photoresist layer 50 being in a region outside a third zone 503 corresponding to a first via in the passivation layer. Optionally, the step of forming the second photoresist layer 50 includes exposing the photoresist material layer 5 with a mask plate, and developing an exposed photoresist material layer to obtain a photoresist pattern having a first section outside the third zone 503, and a second section corresponding to the third zone 503, the photoresist material being removed in the third zone 503 thereby forming a second photoresist layer 50 in the region outside the third zone 503.

Figure 7:
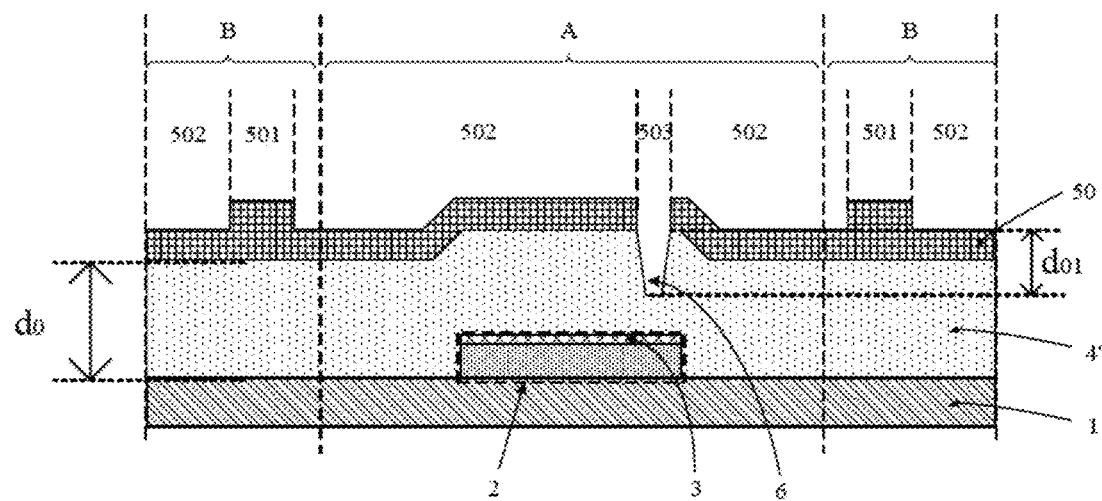

Referring to FIG. 7, the method in some embodiments further includes partially removing the passivation material in the third zone 503 thereby forming a second via 6. In this step, the passivation material in the third zone 503 is not completely removed, i.e., the second via 6 does not extend through the passivation material layer 4'. As shown in FIG. 7, the passivation material layer 4' has a thickness of d0, and the second via 6 has a depth of d01, d01<d0. The step of forming the second via 6 does not expose the source electrode 3 underneath the passivation material layer 4'. Optionally, the passivation material layer 4' is etched to partially remove the passivation material in the third zone 503, e.g., by ion conductive plasma using sulfur hexafluoride as the etching agent.

In some embodiments, the mask plate is a half-tone mask plate or a gray-tone mask plate. The first section outside the third zone 503 includes a first zone 501 and a second zone 502. During the step of exposing the photoresist material layer 5 with the mask plate, the third zone 503 is fully exposed, the first zone 501 is substantially unexposed, and the second zone 502 is partially exposed. The second photoresist layer in the first zone 501 has a thickness greater than that in the second zone 502. The first zone 501 corresponds to the protruding portion of the passivation layer. The second zone 502 corresponds to the remainder of the passivation layer.

Figure 8:
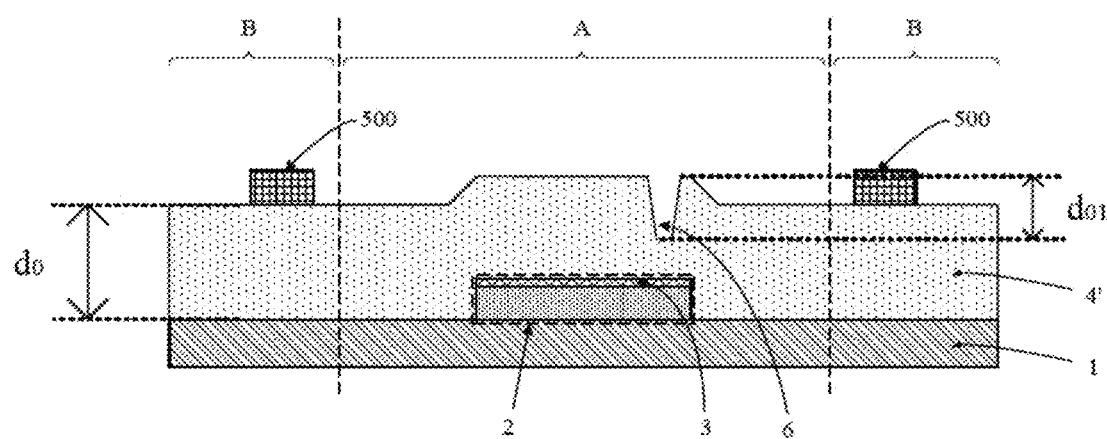

Referring to FIGS. 7 and 8, the method in some embodiments further includes removing the photoresist material outside the first zone 501, e.g., removing the photoresist material in the second zone 502, thereby forming a first photoresist layer 500. The first photoresist layer 500 is on a side of the passivation material layer 4' distal to the base substrate 1, the first photoresist layer being in the first zone 501, e.g., in a region corresponding to the protruding portion. Optionally, the step of removing the photoresist material outside the first zone 501 is performed by ashing the second photoresist layer 50 to remove the photoresist material in the second zone 502, thereby exposing the passivation material layer 4' in the second zone 502. The photoresist material in the first zone 501 remains with a reduced thickness subsequent to the ashing step, thereby forming the first photoresist layer 500.

Figure 9:
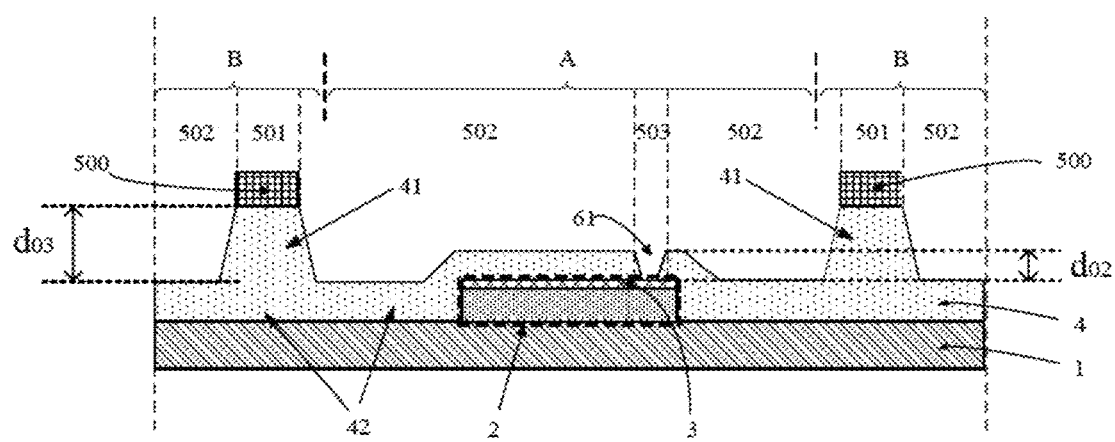

Referring to FIG. 9, the method in some embodiments further includes reducing a thickness of the passivation material layer 4' outside the first zone 501 (e.g., in the second zone 502 and the third zone 503), thereby forming the base portion 42. Optionally, the method further includes removing the first photoresist layer 500 subsequent to reducing the thickness of the passivation material layer 4' outside the first zone 501, thereby forming the protruding portion 41. As shown in FIG. 9, the thickness of the passivation material layer 4' outside the first zone 501 is reduced by d03, which is the thickness of the protruding portion 41. Moreover, the thickness of the passivation material layer 4' in the third zone 503 is further reduced during this step, thereby forming the first via 61 extending through the passivation layer 4 and exposing the source electrode 3. The passivation material in the third zone 503 is completely removed. As shown in FIG. 9, the first via 61 has a depth of d02. To ensure that the passivation material in the third zone 503 is completely removed, typically d02 is equal to or less than d03. Subsequently, a pixel electrode is formed on the passivation layer 4 and electrically connected to the source electrode 3 through the first via 61. To prevent pixel electrode line open in the first via 61, an appropriate depth d02 of the first via 61 is selected, typically d02 is in a range of approximately 0.5 μm to approximately 2 μm. Optionally, and referring to FIGS. 8 and 9, d01+d02=d0. Optionally, the step of reducing the thickness of the passivation material layer 4' outside the first zone 501 is performed by an etching method, e.g., by ion conductive plasma using sulfur hexafluoride as the etching agent.

Figure 10:
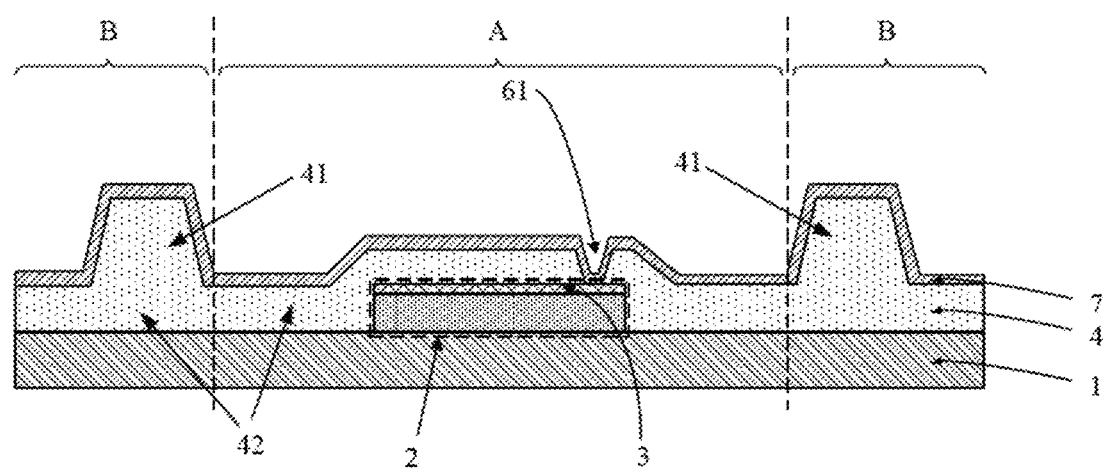

In some embodiments, subsequent to forming the first via, the base portion and the protruding portion, the method further includes forming a pixel electrode on a side of the passivation layer 4 distal to the base substrate 1, the pixel electrode connected to the source electrode 3 through the first via 61. Referring to FIG. 10, the step of forming the pixel electrode includes forming a pixel electrode material layer 7 on a side of the passivation layer 4 distal to the base substrate 1. Various appropriate materials and various appropriate fabricating methods may be used for making the pixel electrode material layer 7. For example, a pixel electrode material may be deposited on the substrate by magnetron sputtering. Examples of materials suitable for making the pixel electrode include, but are not limited to, a metal oxide such as indium tin oxide, indium zinc oxide, and aluminum zinc oxide. As shown in FIG. 10, the pixel electrode material layer 7 is electrically connected to the source electrode 3 through the first via 61.

Figure 11:
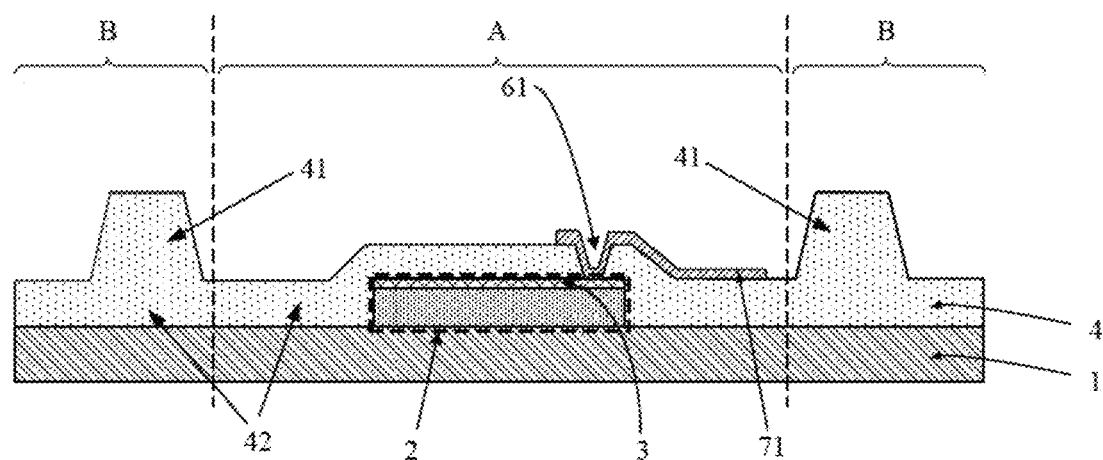

Referring to FIG. 11, the method in some embodiments further includes patterning the pixel electrode material layer to form a pixel electrode layer 71. The pixel electrode layer 71 is electrically connected to the source electrode 3 through the first via 61.

Figure 12:
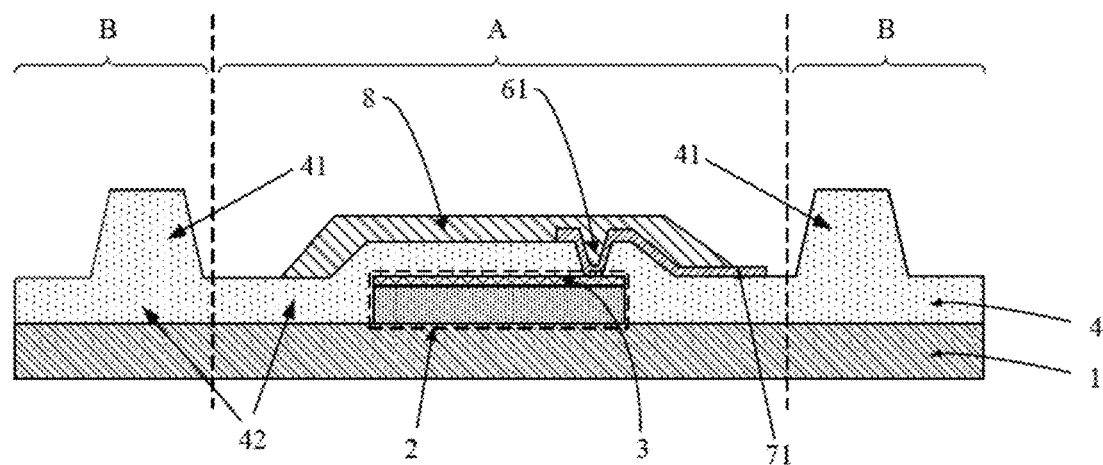

Referring to FIG. 12, the method in some embodiments further includes forming an organic light emitting layer 8 on a side of the pixel electrode layer 71 and the passivation layer 4 distal to the base substrate 1.

In another aspect, the present disclosure provides a method of fabricating a display panel. In some embodiments, the method includes forming a first substrate; forming a second substrate, and assembling the first substrate and the second substrate in a cell. Optionally, the first substrate is an array substrate, and the second substrate is a counter substrate, e.g., an encapsulating substrate in an organic light emitting diode display apparatus. Optionally, the first substrate is a counter substrate, and the second substrate is an array substrate.

Figure 13:
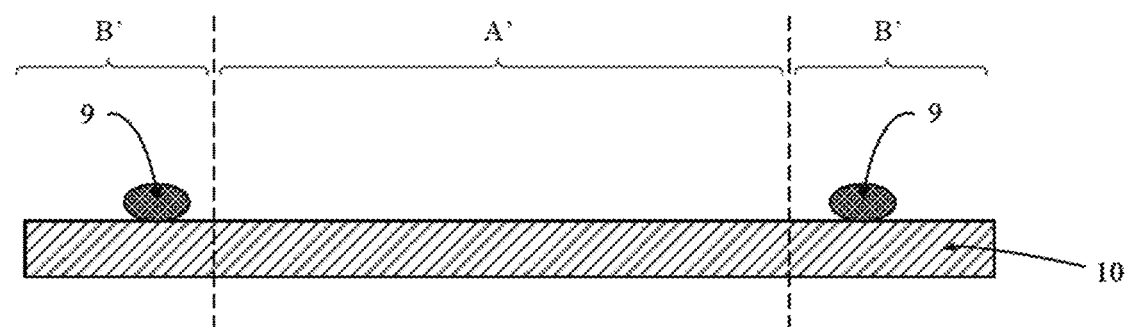
FIGS. 13 to 14 illustrate a process of forming a counter substrate of the display panel in some embodiments according to the present disclosure.
Figure 14:
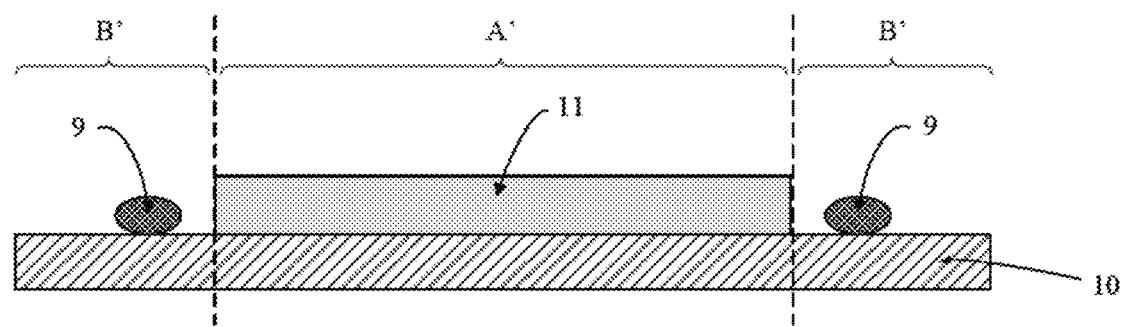

In some embodiments, the first substrate is an array substrate, and the step of forming the first substrate is according to the method of forming an array substrate described above and in FIGS. 3 to 12. In some embodiments, the second substrate is a counter substrate, e.g., an encapsulating substrate in an organic light emitting diode display apparatus. FIGS. 13 to 14 illustrate a process of forming a counter substrate of the display panel in some embodiments according to the present disclosure. Referring to FIG. 13, the method includes forming a sealant material layer 9 on a second base substrate 10, the sealant material layer 9 is formed in a peripheral area B' of the second substrate and encloses a display area A' of the second substrate. Referring to FIG. 14, the method in some embodiments further includes forming an encapsulating film 11 on the second base substrate 10 in a display area A' of the second substrate. Optionally, the thickness of the encapsulating film 11 is substantially the same as the thickness of the protruding portion. Optionally, the encapsulating film 11 has a thickness in a range of approximately 2 μm to approximately 19 μm, e.g., approximately 2 μm to approximately 5 μm, approximately 5 μm to approximately 10 μm, and approximately 10 μm to approximately 19 μm.

Various appropriate encapsulating materials and various appropriate fabricating methods may be used to make the encapsulating film 11. For example, the encapsulating film 11 may be fabricated by sputtering, chemical vapor deposition, or plasma enhanced chemical vapor deposition. Examples of appropriate materials for making the encapsulating film 11 include organic materials and inorganic material. Examples of organic materials for making the encapsulating film 11 include, but are not limited to, parylene (poly-p-xylylene) (PPX), poly-2-chloro-p-xylylene (PCPX), poly[2-methoxy-r-(2' ethylhexyloxy)-1,4-phenylene vinylene], resins, polyimide, and the like. Examples of inorganic materials for making the encapsulating film 11 include, but are not limited to, silicon oxide, silicon nitride (e.g., $Si_3N_4$), silicon oxynitride ($SiO_xN_y$). Optionally, the encapsulating film 11 is made of an organic material.

Figure 15:
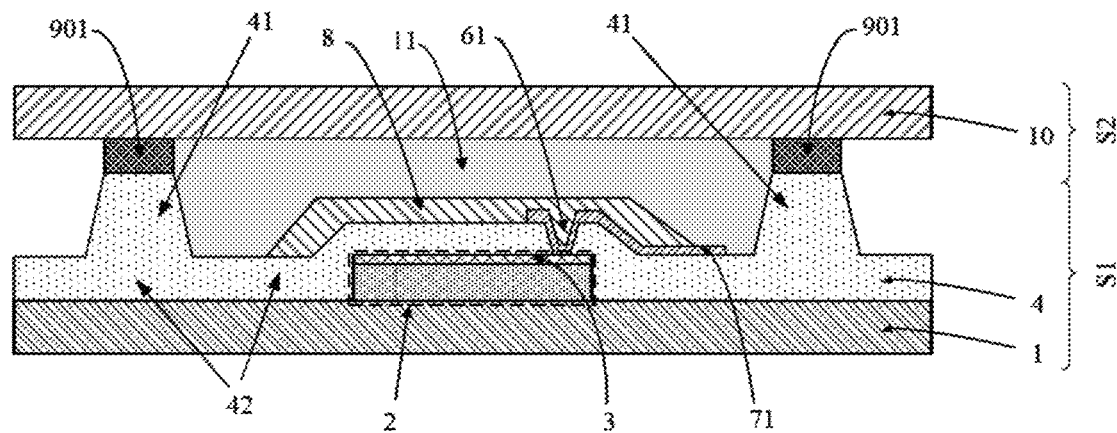
FIGS. 15 to 17 illustrate a process of assembling the array substrate and the counter substrate in some embodiments according to the present disclosure.
Figure 16:
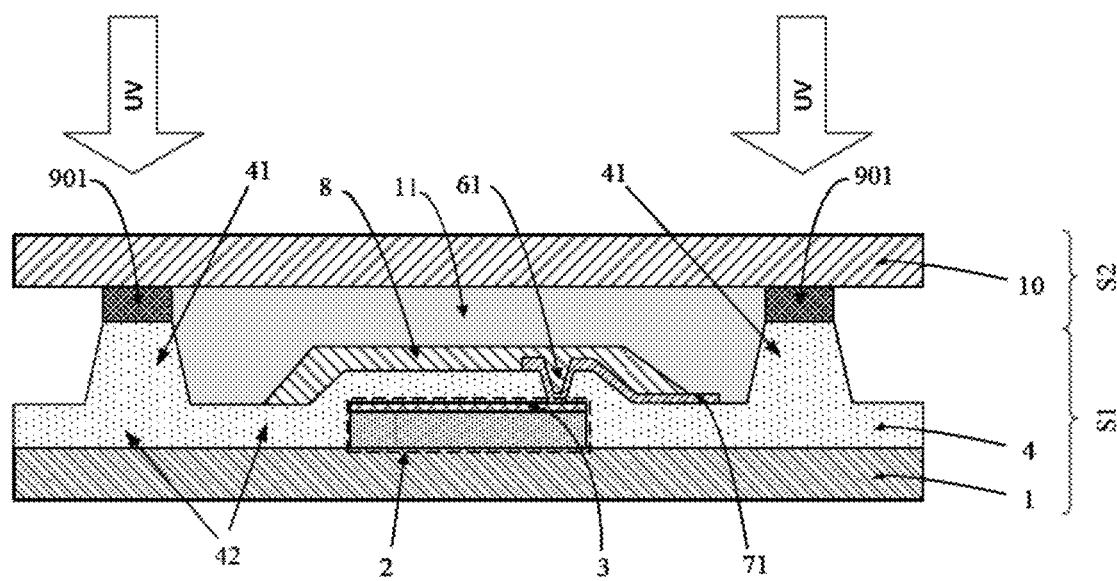
Figure 17:
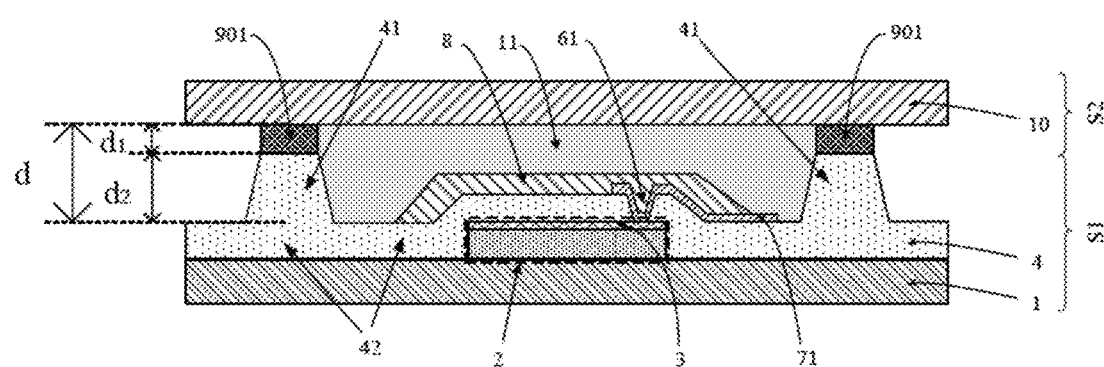

FIGS. 15 to 17 illustrate a process of assembling the array substrate and the counter substrate in some embodiments according to the present disclosure. Referring to FIG. 15, the step of assembling the first substrate S1 and the second substrate S2 in the cell in some embodiments includes adhering a sealant material layer (see, e.g., the sealant material layer 9 in FIG. 13 and FIG. 14) onto the protruding portion 41, thereby sealing a display area of the display panel. Subsequent to assembling the first substrate S1 and the second substrate S2, the encapsulating film 11 encapsulates the display units (e.g., the organic light emitting layer 8) in the display area of the display panel. Referring to FIG. 16, the method further includes curing the sealant layer 901, e.g., using UV radiation. FIG. 17 shows a display panel fabricated by the present method.

In a display panel fabricated by the present method, by having a protruding portion, an amount of sealant material required to seal the present display panel is much reduced. For example, in the conventional display panel of FIG. 1, a sealant layer 902 having a thickness d is required to seal the display panel, whereas the thickness of the sealant layer 901 in the display panel fabricated by the present method is significantly reduced to d1 in the present display panel. The issue of oxygen and moist permeation through the pores and defects of sealant layer 901 can be obviated as the total area of the sealant layer 901 exposing to the external environment is much smaller than that in the conventional display panel. The protruding portion 41 makes up a majority of the barrier isolating the inside of the display panel from the external environment. Because the protruding portion 41 is made of a passivation material having a high hermeticity, the present display panel is highly oxygen resistant and moist resistant.

In another aspect, the present disclosure provides a display apparatus having a display panel described herein or fabricated by a method described herein. Examples of appropriate display apparatuses include, but are not limited to, an electronic paper, a mobile phone, a tablet computer, a television, a monitor, a notebook computer, a digital album, a GPS, etc. Optionally, the display apparatus is an organic light emitting diode display apparatus. Optionally, the display apparatus is a liquid crystal display apparatus.

The foregoing description of the embodiments of the invention has been presented for purposes of illustration and description. It is not intended to be exhaustive or to limit the invention to the precise form or to exemplary embodiments disclosed. Accordingly, the foregoing description should be regarded as illustrative rather than restrictive. Obviously, many modifications and variations will be apparent to practitioners skilled in this art. The embodiments are chosen and described in order to explain the principles of the invention and its best mode practical application, thereby to enable persons skilled in the art to understand the invention for various embodiments and with various modifications as are suited to the particular use or implementation contemplated. It is intended that the scope of the invention be defined by the claims appended hereto and their equivalents in which all terms are meant in their broadest reasonable sense unless otherwise indicated. Therefore, the term "the invention", "the present invention" or the like does not necessarily limit the claim scope to a specific embodiment, and the reference to exemplary embodiments of the invention does not imply a limitation on the invention, and no such limitation is to be inferred. The invention is limited only by the spirit and scope of the appended claims. Moreover, these claims may refer to use "first", "second", etc. following with noun or element. Such terms should be understood as a nomenclature and should not be construed as giving the limitation on the number of the elements modified by such nomenclature unless specific number has been given. Any advantages and benefits described may not apply to all embodiments of the invention. It should be appreciated that variations may be made in the embodiments described by persons skilled in the art without departing from the scope of the present invention as defined by the following claims. Moreover, no element and component in the present disclosure is intended to be dedicated to the public regardless of whether the element or component is explicitly recited in the following claims.

What is claimed is:

1. A display panel, comprising:
   a first substrate; and
   a second substrate facing the first substrate;
   wherein the first substrate comprises:
   a base substrate; and
   an insulating passivation layer on the base substrate, the insulating passivation layer comprising a base portion extending from a display area of the display panel into a peripheral area of the display panel, and a protruding portion in the peripheral area and on a side of the base portion in the peripheral area away from the base substrate;
   wherein the display panel further comprises:
   a sealant layer on a side of the protruding portion away from the base portion, the sealant layer in the peripheral area of the display panel, and configured to seal the first substrate and the second substrate together to form a cell;
   an organic light emitting layer in the display area and on a side of the insulating passivation layer away from the base substrate; and
   an encapsulating film on a side of the organic light emitting layer away from the base substrate for encapsulating the organic light emitting layer;
   wherein the protruding portion encloses the display area of the display panel;
   the insulating passivation layer in a region having the protruding portion has a first total thickness greater than a second total thickness of the insulating passivation layer in regions outside the region having the protruding portion;
the first total thickness comprises a thickness of the base portion in the region having the protruding portion and a thickness of the protruding portion;
the sealant layer is in direct contact with the protruding portion and is limited in the region having the protruding portion;
lateral sides of the sealant layer and the protruding portion in the peripheral area are in direct contact with the encapsulating film; and
a maximum height of the protruding portion relative to the base substrate is greater than a maximum height of the organic light emitting layer relative to the base substrate.

2. The display panel of claim 1,
wherein the sealant layer is in direct contact with the second substrate.

3. The display panel of claim 1, wherein the protruding portion and the base portion are integral parts of the insulating passivation layer, and comprise a same material.

4. The display panel of claim 3, wherein the protruding portion and the base portion comprise silicon nitride.

5. The display panel of claim 1, wherein the first total thickness is in a range of 5 µm to 20 µm; and
the thickness of the protruding portion is in a range of 2 µm to 19 µm.

6. The display panel of claim 2, wherein the sealant layer has a thickness less than 50% of the thickness of the protruding portion.

7. The display panel of claim 1, further comprising:
a thin film transistor on a side of the insulating passivation layer closer to the base substrate; and
a pixel electrode on a side of the insulating passivation layer away from the base substrate;
wherein the pixel electrode is connected to a source electrode of the thin film transistor through a via extending through the insulating passivation layer.

8. A display apparatus, comprising the display panel of claim 1, and one or more circuits connected to the display panel.

9. A display substrate, comprising:
a base substrate; and
an insulating passivation layer on the base substrate, the insulating passivation layer comprising a base portion extending from a display area of the display substrate into a peripheral area of the display substrate, and a protruding portion in the peripheral area and on a side of the base portion in the peripheral area away from the base substrate;
a sealant layer on a side of the protruding portion away from the base portion, the sealant layer in the peripheral area of the display substrate;
an organic light emitting layer in the display area and on a side of the insulating passivation layer away from the base substrate; and
an encapsulating film on a side of the organic light emitting layer away from the base substrate for encapsulating the organic light emitting layer;
wherein the protruding portion encloses the display area of the display substrate;
the insulating passivation layer in a region having the protruding portion has a first total thickness greater than a second total thickness of the insulating passivation layer in regions outside the region having the protruding portion;
the first total thickness comprises a thickness of the base portion in the region having the protruding portion and a thickness of the protruding portion;
the sealant layer is in direct contact with the protruding portion and is limited in the region having the protruding portion;
lateral sides of the sealant layer and the protruding portion in the peripheral area are in direct contact with the encapsulating film; and
a maximum height of the protruding portion relative to the base substrate is greater than a maximum height of the organic light emitting layer relative to the base substrate.

10. The display substrate of claim 9, wherein the protruding portion and the base portion are integral parts of the insulating passivation layer, and comprise a same material.

11. The display substrate of claim 10, wherein the protruding portion and the base portion comprise silicon nitride.

12. The display substrate of claim 9, wherein the first total thickness is in a range of 5 µm to 20 µm; and
the thickness of the protruding portion is in a range of 2 µm to 19 µm.

13. A method of fabricating a display substrate, comprising:
forming an insulating passivation layer on a base substrate, the insulating passivation layer is formed to comprise a base portion extending from a display area of the display substrate into a peripheral area of the display substrate, and a protruding portion in the peripheral area and on a side of the base portion in the peripheral area away from the base substrate;
forming a sealant layer on a side of the protruding portion away from the base portion, the sealant layer in the peripheral area of the display substrate;
forming an organic light emitting layer in the display area and on a side of the insulating passivation layer away from the base substrate; and
forming an encapsulating film on a side of the organic light emitting layer away from the base substrate for encapsulating the organic light emitting layer;
wherein the protruding portion is formed encloses the display area of the display substrate;
the insulating passivation layer in a region having the protruding portion is formed to have a first total thickness greater than a second total thickness of the insulating passivation layer in regions outside the region having the protruding portion;
the first total thickness comprises a thickness of the base portion in the region having the protruding portion and a thickness of the protruding portion;
the sealant layer is formed to be in direct contact with the protruding portion and is limited in the region having the protruding portion;
lateral sides of the sealant layer and the protruding portion in the peripheral area are in direct contact with the encapsulating film; and
a maximum height of the protruding portion relative to the base substrate is greater than a maximum height of the organic light emitting layer relative to the base substrate.

14. The method of claim 13, wherein forming the insulating passivation layer comprises:
forming an insulating passivation material layer on the base substrate;
forming a first photoresist layer on a side of the insulating passivation material layer distal to the base substrate, the first photoresist layer being in a first region corresponding to the protruding portion;

reducing a thickness of the insulating passivation material layer outside the first region, thereby forming the base portion; and removing the first photoresist layer subsequent to reducing the thickness of the insulating passivation material layer outside the first region, thereby forming the protruding portion.

15. The method of claim 14, prior to forming the first photoresist layer, further comprising:

forming a second photoresist layer on a side of the insulating passivation material layer distal to the base substrate, the second photoresist layer being in a region outside a second region corresponding to a first via in the insulating passivation layer;

partially removing the insulating passivation material layer in the second region thereby forming a second via; and removing the second photoresist layer outside the first region, thereby forming the first photoresist layer;

wherein during reducing the thickness of the insulating passivation material layer outside the first region, the insulating passivation material layer in the second region is completely removed, thereby forming the first via, the first via extending through the insulating passivation layer.

16. The method of claim 15, prior to forming the forming the insulating passivation material layer, further comprising forming a thin film transistor on the base substrate, the thin film transistor comprising a source electrode; and subsequent to forming the first via, the base portion and the protruding portion, the method further comprises forming a pixel electrode on a side of the insulating passivation layer distal to the base substrate, the pixel electrode connected to the source electrode through the first via.

17. The method of claim 15, wherein the base portion, the protruding portion, and the first via are formed in a single process using a single mask plate.

18. A method of fabricating a display panel, comprising:

forming a first substrate according to the method of claim 13;

forming a second substrate; and assembling the first substrate and the second substrate in a cell;

wherein forming the second substrate comprises forming a sealant material layer on a second base substrate, the sealant material layer is formed in a peripheral area of the second substrate and enclosing a display area of the second substrate; and assembling the first substrate and the second substrate in the cell comprises adhering the sealant material layer onto the protruding portion, thereby forming a sealant layer sealing a display area of the display panel.

* * * * *